(12) United States Patent
Ausserlechner

(10) Patent No.: US 9,018,948 B2
(45) Date of Patent: Apr. 28, 2015

(54) HALL SENSORS AND SENSING METHODS

(75) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 182 days.

(21) Appl. No.: 13/559,197

(22) Filed: Jul. 26, 2012

(65) Prior Publication Data

US 2014/0028304 A1    Jan. 30, 2014

(51) Int. Cl.
*G01B 7/30* (2006.01)
*G01R 33/06* (2006.01)
*G01R 33/07* (2006.01)
*G01R 19/25* (2006.01)

(52) U.S. Cl.
CPC .................................... *G01R 19/25* (2013.01)

(58) Field of Classification Search
CPC .... G01R 33/07; G01R 33/075; G01R 33/077; H01L 27/22
USPC ....................... 324/251, 117 H, 207.2, 207.12
See application file for complete search history.

(56) References Cited

U.S. PATENT DOCUMENTS

| | | | |
|---|---|---|---|
| 3,823,354 A | 7/1974 | Janssen | |
| 4,041,026 A | 8/1977 | Ogata | |
| 5,747,995 A | 5/1998 | Spies | |
| 6,064,202 A * | 5/2000 | Steiner et al. | 324/251 |
| 6,184,679 B1 | 2/2001 | Popovic | |
| 6,727,563 B1 * | 4/2004 | Hohe et al. | 257/427 |
| 6,768,301 B1 * | 7/2004 | Hohe et al. | 324/251 |
| 7,425,821 B2 | 9/2008 | Monreal et al. | |
| 7,782,050 B2 | 8/2010 | Ausserlechner | |
| 7,872,322 B2 | 1/2011 | Schott | |
| 8,030,918 B2 | 10/2011 | Doogue et al. | |
| 8,093,891 B2 * | 1/2012 | Rocznik et al. | 324/251 |
| 8,114,694 B2 | 2/2012 | Kim | |
| 8,829,900 B2 * | 9/2014 | Ausserlechner | 324/251 |

(Continued)

FOREIGN PATENT DOCUMENTS

| | | |
|---|---|---|
| CN | 101762796 A | 6/2010 |
| CN | 101923266 A | 12/2010 |

(Continued)

OTHER PUBLICATIONS

Munter, P J A, *A Low-offset Spinning-current Hall Plate*, Sensors and Actuators, A21-A23, 1990, pp. 743-746.

(Continued)

*Primary Examiner* — Reena Aurora
(74) *Attorney, Agent, or Firm* — Eschweiler & Associates, LLC

(57) ABSTRACT

Embodiments relate to multi-contact sensor devices and operating methods thereof that can reduce or eliminate offset error. In embodiments, sensor devices can comprise three or more contacts, and multiple sensor devices can be combined. The sensor devices can comprise Hall sensor devices, such as vertical Hall devices, or other sensor types. Operating modes can be implemented for the multi-contact sensor devices which offer significant modifications of and improvements over conventional spinning current principles. In a first operating mode, the sensor is supplied with the same input current in all operating phases, with the output voltages of all operating cycles sensed and processed. In another operating mode, the sensor device is supplied with the same input voltage in all operating phases, the sense terminals are forced to constant potentials, and the currents flowing into or out of the sense terminals are sensed and processed.

34 Claims, 16 Drawing Sheets

(56) References Cited

U.S. PATENT DOCUMENTS

| | | | |
|---|---|---|---|
| 8,896,303 B2 * | 11/2014 | Ausserlechner et al. | 324/251 |
| 2003/0102909 A1 | 6/2003 | Motz | |
| 2004/0212029 A1 | 10/2004 | Boor | |
| 2005/0258840 A1 | 11/2005 | Ausserlechner | |
| 2006/0097715 A1 | 5/2006 | Oohira | |
| 2009/0256559 A1 | 10/2009 | Ausserlechner | |
| 2010/0002821 A1 | 1/2010 | Hammerschmidt et al. | |
| 2010/0123458 A1 | 5/2010 | Schott | |
| 2010/0133632 A1 | 6/2010 | Schott | |
| 2011/0074405 A1 | 3/2011 | Doogue | |
| 2012/0001279 A1 | 1/2012 | Hioka et al. | |
| 2012/0169329 A1 | 7/2012 | Hellwig | |
| 2013/0015853 A1 | 1/2013 | Raz et al. | |
| 2013/0021026 A1 | 1/2013 | Ausserlechner | |
| 2013/0069640 A1 | 3/2013 | Ausserlechner | |
| 2013/0069641 A1 | 3/2013 | Motz et al. | |
| 2013/0127453 A1 | 5/2013 | Ausserlechner et al. | |
| 2013/0214775 A1 | 8/2013 | Ausserlechner et al. | |
| 2014/0084911 A1 | 3/2014 | Asserlechner et al. | |
| 2014/0210458 A1 | 7/2014 | Ausserlechner et al. | |
| 2014/0210461 A1 | 7/2014 | Ausserlechner et al. | |

FOREIGN PATENT DOCUMENTS

| | | |
|---|---|---|
| DE | 4141386 | 6/1993 |
| DE | 4302342 | 7/1993 |
| DE | 10150950 | 6/2003 |
| DE | 102006037226 | 2/2008 |
| EP | 1438755 B1 | 1/2005 |
| EP | 2071347 | 6/2009 |
| EP | 2192417 | 6/2010 |
| EP | 2546670 | 1/2013 |
| JP | 1251763 | 10/1989 |
| WO | WO03036733 | 5/2003 |
| WO | WO2004025742 | 3/2004 |
| WO | WO 2008/048379 A1 | 4/2008 |
| WO | WO2009050673 | 4/2009 |

OTHER PUBLICATIONS

Popovic, "Hall Devices for Magnetic Sensor Microsystems", IEEE Transducers 1997, pp. 377-380.

Ausserlechner, Udo, *Limits of Offset Cancellation by the Principle of Spinning Current Hall Probe*, Infineon Technologies AG, 4 pages, Oct. 2004.

Vanha, Ralph, *Trench-Hall Devices*, Journal of Microelectromechanical Systems, vol. 9, No. 1, Mar. 2000, pp. 82-87.

De Jong, Paul C., *40.1 Smart Silicon Sensors—Examples of Hall-effect Sensors*, Sensors 2002 Proceedings of IEEE, 5 pages.

Application and File History for U.S. Appl. No. 13/223,527, filed Sep. 15, 2011 inventor Ausserlechner.

Application and File History for U.S. Appl. No. 13/627,468, filed Sep. 26, 2012, inventor Ausserlechner et al.

Application and File History for U.S. Appl. No. 13/753,190, filed Jan. 29, 2013 inventors Ausserlechner et al.

Application and File History for U.S. Appl. No. 13/621,336, filed Sep. 17, 2012, inventors Motz et al.

German Examination Report for German Application No. 102013110633.1 dated May 27, 2014. English translation not provided.

Chinese Application No. 2012103459284, Chinese Office Action, mailed Oct. 10, 2014, 7 pages.

Specification, Claims, Abstract, Drawings and Filing Receipt for U.S. Appl. No. 13/920,777, filed Jun. 18, 2013.

* cited by examiner

Phase 1:

Equivalent circuit diagram:

Phase 2:

Equivalent circuit diagram:

Phase 3:

Equivalent circuit diagram:

Phase 4:

Equivalent circuit diagram:

Phase 5:

Equivalent circuit diagram:

Phase 6:

Equivalent circuit diagram:

Phase 1:

Equivalent circuit diagram:

Phase 2:

Equivalent circuit diagram:

Phase 3:

Equivalent circuit diagram:

Phase 4:

Equivalent circuit diagram:

Phase 5:

Equivalent circuit diagram:

Phase 6:
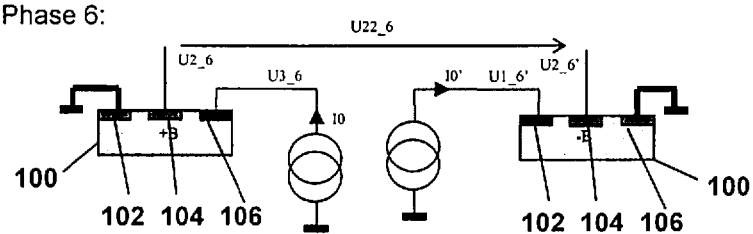
Equivalent circuit diagram:
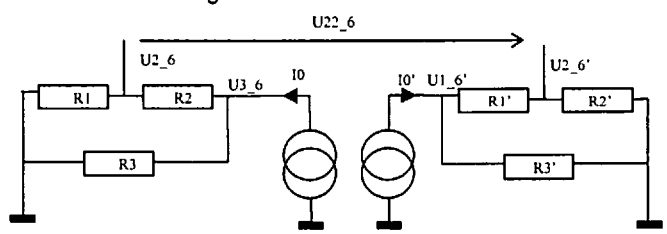
FIG. 3F
Phase ph1: Ui-forcing
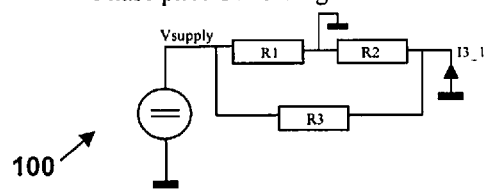
Phase ph2: Ui-forcing
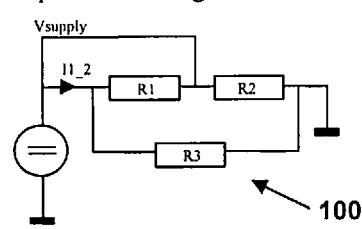
FIG. 4A     FIG. 4B

HALL SENSORS AND SENSING METHODS

TECHNICAL FIELD

The invention relates generally to sensors and more particularly to offset cancelation in Hall sensor devices.

BACKGROUND

Magnetic field sensors, such as Hall sensors, are sensitive to magnetic fields but can suffer from offset error. Offset error is the presence of an output signal in the absence of some input quantity. In an example related to Hall sensors, the offset error would be an output signal indicative of an input magnetic field when in fact no magnetic field is present.

Offset error can relate to different causes, two of which are raw offset error and residual offset error. Raw offset error can refer to an offset error present in a particular operating phase. Residual offset error can refer to an offset error present in an overall or total output signal, such as a signal which is a combination of those from individual operating phases.

One approach for reducing or eliminating offset error is using a multi-contact Hall sensor. Three-contact or four-contact Hall sensors can be operated in a spinning current-type mode, which changes the supply or sense role of the contacts in multiple clock phases such that any offset is reduced when the signals from the multiple clock phases are combined. Even so, the residual offset error can remain higher than desired, such as in the range of about 1 milli-Tesla (mT).

Therefore, there is a need for improved multi-contact Hall sensor devices.

SUMMARY

Embodiments relate to reducing residual offset in multi-contact sensor devices.

In an embodiment, a sensor device comprises at least one sensor element configured to sense a physical characteristic and comprising three contacts; and sensor circuitry coupled to the at least one sensor element and configured to operate the at least one sensor element in a plurality of operating phases such that in each operating phase a supply current is injected into one of the three contacts as a supply contact and a potential is measured at a second of the three contacts as a signal contact, each operating phase having a first arrangement of the three contacts as supply contact and signal contact and having a corresponding operating phase in which a second arrangement of the three contacts is reversed ones of the three contacts as the supply contact and the signal contact as compared with the first arrangement, and an output of the sensor device is related to a combination of the potentials measured at the signal contacts in the plurality of operating phases, wherein the plurality comprises each operating phase and the corresponding operating phase.

In an embodiment, a sensor device comprises at least one sensor element configured to sense a physical characteristic and comprising three contacts; and sensor circuitry coupled to the at least one sensor element and configured to operate the at least one sensor element in a plurality of operating phases such that in each operating phase first and second supply potentials are applied respectively to two of the three contacts as supply contacts and one of the supply potentials is applied to a third of the three contacts as a signal contact, a current at the third of the three contacts is measured, and an output of the sensor device is related to a combination of the currents measured at the signal contacts across all operating phases.

In an embodiment, a sensor device comprises at least one sensor element configured to sense a physical characteristic and comprising three contacts; and sensor circuitry coupled to the at least one sensor element and configured to operate the at least one sensor element in a plurality of operating phases such that in each operating phase first and second supply potentials are applied respectively to two of the three contacts as supply contacts and a forced potential that is the same in each of the plurality of operating phases is applied to a third of the three contacts as a signal contact, a current at the third of the three contacts is measured, and an output of the sensor device is related to a combination of the currents measured at the signal contacts in the plurality of operating phases.

BRIEF DESCRIPTION OF THE DRAWINGS

The invention may be more completely understood in consideration of the following detailed description of various embodiments of the invention in connection with the accompanying drawings, in which:

FIG. 3F is a circuit diagram of a sensor device in a sixth operating phase according to an embodiment.

FIG. 4A is a circuit diagram of a sensor device in a first operating phase according to an embodiment.

FIG. 4B is a circuit diagram of a sensor device in a second operating phase according to an embodiment.

Figure 1:
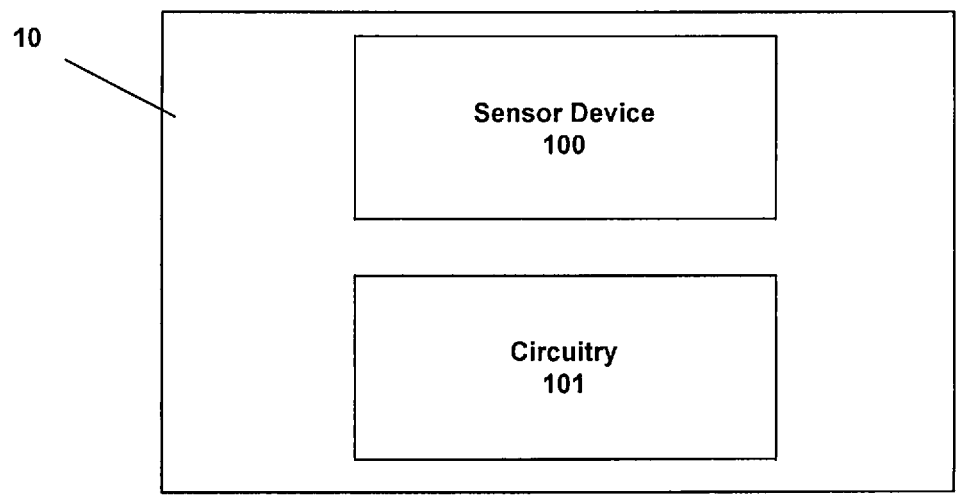
FIG. 1 is a block diagram of a sensor system according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to multi-contact sensor devices and operating methods thereof that can reduce or eliminate offset error. In embodiments, sensor devices can comprise three or more contacts, and multiple such sensor devices can be combined. The sensor devices can comprise Hall sensor devices, such as vertical Hall devices, or other sensor types in embodiments. Operating modes can be implemented for the multi-contact sensor devices which offer significant modifications of and improvements over conventional spinning current principles, including reduced residual offset. As previously mentioned, offset error can relate to different causes, two of which are raw offset error and residual offset error. Raw offset error can refer to an offset error present in a particular operating phase, whereas residual offset error can refer to an offset error present in an overall or total output signal, such as a signal which is a combination of those from individual operating phases. Therefore, raw offset errors in multiple operating phases can be combined to create either an increased residual offset error, which is undesired, or to partially or completely cancel raw offset errors such that the residual offset error is reduced or eliminated.

Therefore, in a first such operating mode referred to herein as Iu-biasing, the sensor is supplied with the same input current in all operating phases, with the output voltages of all operating cycles sensed and processed. In another operating mode referred to herein as Ui-forcing, the sensor device is supplied with the same input voltage in all operating phases, the sense terminals are clamped (or forced) to constant potentials, and the currents flowing into or out of the sense terminals are sensed and processed. In either mode, embodiments provide reductions in residual offset that offer advantages over conventional spinning current and other techniques.

Referring to FIG. 1, a sensor system 10 is depicted. Sensor system 10 comprises a sensor device 100 coupled to circuitry 101. Circuitry 101 can comprise switching circuitry, signal processing circuitry and other circuitry to implement the various phases and/or modes discussed herein below as well as other functions of system 10. For example, in an embodiment sensor device 100 comprises a three-contact device, and the three contacts are coupled differently with an electric supply and an output signal in each of six phases of a first operating mode. This and other embodiments will be discussed in more detail below with respect to at least two such operating modes: Iu-biasing and Ui-forcing.

Referring to FIG. 2, an Iu-biasing operating mode will be discussed with reference to a sensor device 100 depicted in cross-section and having three contacts 102, 104 and 106. Sensor device 100 comprises an active region responsive to a physical characteristic, such as a magnetic field, temperature, mechanical stress or some other quantity, extending downward into device 100 from the top surface as depicted in the figures. Contacts 102, 104 and 106 are disposed on the top surface in ohmic contact with the active region. More or fewer contacts can be used in other embodiments, and the contacts can be otherwise arranged in other embodiments.

In the embodiment of FIG. 2, sensor device 100 comprises a Hall effect sensor device, such as a vertical Hall device, though sensor device 100 can comprise some other type of sensor in other embodiments. As depicted in FIG. 2, sensor device 100 comprises a vertical Hall device depicted in cross-section, with an active Hall region extending from a top surface of device 100 to a suitable depth and comprising three contacts 102, 104 and 106 on that top surface and in ohmic contact with the active Hall region. FIG. 2 also includes simplified equivalent circuit diagrams for sensor device 100, with R1 representing a coupling of or resistance between contacts 102 and 104; R2, contacts 104 and 106; and R3, contacts 102 and 106. In the examples herein, R1 and R2 are assumed to be approximately equal given the symmetry of device 100 but could have a mismatch with each other on the order of about 1% to about 5% because of tolerances, mechanical stresses, electric non-linearity and other factors, while R3 generally is larger. Contacts 102, 104 or 106 labeled "B+" indicate that the signal at this contact increases with increasing magnetic field, whereas those labeled "B−" indicate the opposite, that the signal at that contact decreases with increasing magnetic field.

In an embodiment, six different operating phases are implemented in an improved spinning current-like technique in which the coupling arrangement of contacts 102, 104 and 106 with a current supply, output signal and a reference potential, such as ground or some other potential (e.g., 1 V), vary in each phase. Each of these phases will be discussed below, though the particular number and relative order of phases can vary in embodiments, such as according to spinning current sequence frequency or some other factor. For example, the relative order of phases can be selected such that the voltages in sequential operating phases change marginally, at least at the sense terminals, to avoid build-up of stray capacitances that require discharge. Therefore, in embodiment an order of phases can be Phases 1 and 3, 2 and 5, and 4 and 6, to avoid, for example, changing the potentials at all of the contacts between phases, such as from Phase 1 to Phase 2. In other embodiments, the phases can be sequential clock phases.

Figure 2A:
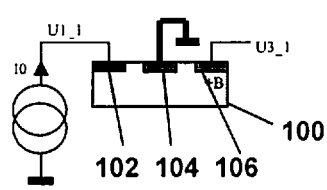
FIG. 2A is a circuit diagram of a sensor device in a first operating phase according to an embodiment.
Figure 2A:
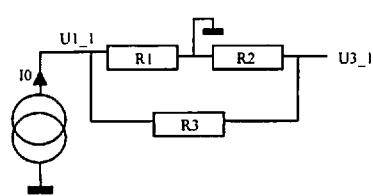

In FIG. 2A, Phase 1, first contact 102 is the supply contact, and third contact 106 is the signal contact:

$$U3\_1=U1\_1*R2/(R2+R3),$$

with $$U1\_1=I0*R1//(R2+R3)$$

such that $$U3\_1=I0*R1*R2/(R1+R2+R3),$$

where U1_1 denotes the voltage at the first contact 102 in the first phase, and U3_1 denotes the voltage at the third contact 106 in the first phase (this labeling system will be used herein throughout).

Figure 2B:
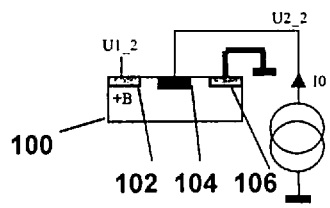
FIG. 2B is a circuit diagram of a sensor device in a second operating phase according to an embodiment.
Figure 2B:
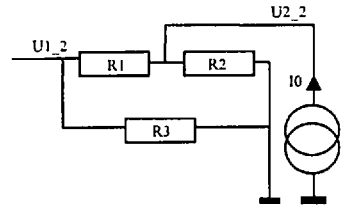

In FIG. 2B, Phase 2, contacts 102, 104 and 106 are recoupled such that first contact 102 is the signal contact, and second contact 104 is the supply contact:

$$U1\_2=U2\_2*R3/(R1+R3)$$

with $$U2\_2=I0*R2//(R1+R3)$$

such that $$U1\_2=I0*R2*R3/(R1+R2+R3).$$

The use here and elsewhere herein of the notation "//" signifies a parallel connection of two resistances, i.e., R1//R2=R1*R2/(R1+R2).

Figure 2C:
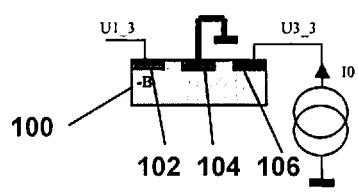
FIG. 2C is a circuit diagram of a sensor device in a third operating phase according to an embodiment.
Figure 2C:
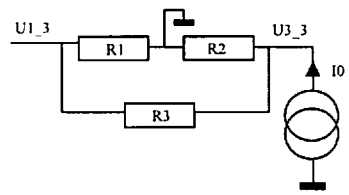

In FIG. 2C, Phase 3, first contact 102 is the signal contact, and third contact 106 is the supply contact:

$$U1\_3=U3\_3*R1/(R1+R3)$$

with $$U3\_3=I0*R2//(R1+R3)$$

such that $$U1\_3=I0*R1*R2/(R1+R2+R3).$$

Figure 2D:
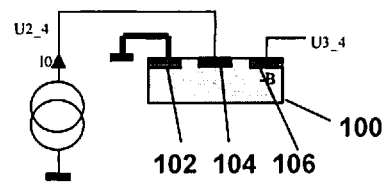
FIG. 2D is a circuit diagram of a sensor device in a fourth operating phase according to an embodiment.
Figure 2D:
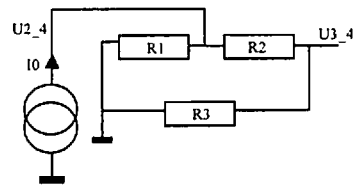

In FIG. 2D, Phase 4, second contact 104 is the supply contact, and third contact 106 is the signal contact:

$$U3\_4=U2\_4*R3/(R2+R3)$$

with $$U2\_4=I0*R1//(R2+R3)$$

such that $$U3\_4=I0*R1*R3/(R1+R2+R3).$$

Figure 2E:
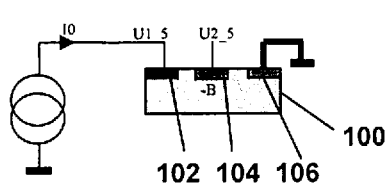
FIG. 2E is a circuit diagram of a sensor device in a fifth operating phase according to an embodiment.
Figure 2E:
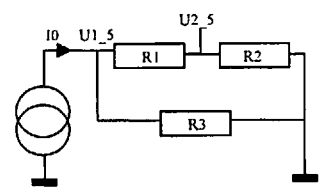

In FIG. 2E, Phase 5, first contact 102 is the supply contact, and second contact 104 is the signal contact:

$$U2\_5=U1\_5*R2/(R1+R2)$$

with $$U1\_5=I0*R3//(R1+R2)$$

such that $$U2\_5=I0*R2*R3/(R1+R2+R3).$$

Figure 2F:
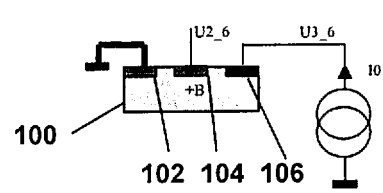
FIG. 2F is a circuit diagram of a sensor device in a sixth operating phase according to an embodiment.
Figure 2F:
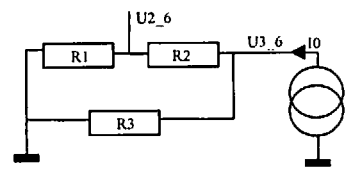

Finally, in FIG. 2F, Phase 6, second contact 104 is the signal contact, and third contact 106 is the supply contact:

$$U2\_6=U3\_6*R1/(R1+R2)$$

with $$U3\_6=I0*R3//(R1+R2)$$

such that $$U2\_6=I0*R1*R3/(R1+R2+R3).$$

Figure 2G:
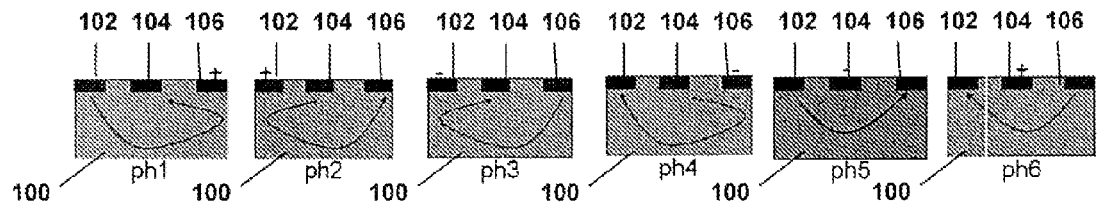
FIG. 2G is a diagram of the six operating phases of FIGS. 2A-2F.

FIG. 2G summarizes the operating modes in each of the six phases. The arrows represent current streamlines from a positive to a negative terminal. The "+" and "−" annotations are as discussed above with respect to "B+" and "B−," respectively. Signal processing circuitry 101 coupled to sensor device 100 can then process the signals from each phase to obtain an advantageous result.

For example, while U1_2 −U3_4 doubles the contribution of the magnetic field, it does not cancel the offset voltage. U2_6 −U2_5 provides the same result. Looking at the other signals, however, if U1_3 is subtracted from U3_1, the contributions of the applied magnetic field are added while the offset voltage is cancelled because these signals are the same, i.e., U1_3 =I0 *R1*R2/(R1+R2+R3) and U3_1=I0 *R1*R2/(R1+R2+R3). In other words, any offset in device 100 is the same for each phase and therefore eliminated by the subtraction of one from the other. The same is true for U1_2−U2_5 and U2_6−U3_4. Note that this applies generally for linear devices, whereas for non-linear devices it is generally valid only in an approximation. This approximation is more accurate if more pairs of signals are combined, such that an advantageous total signal is:

$$U\_total=(U3\_1-U1\_3)+(U1\_2-U2\_5)+(U2\_6-U3\_4)=U3\_1+U1\_2+U2\_6-U1\_3-U3\_4-U2\_5.$$

According to this equation, the six operating phases are grouped in three groups, with each group comprising two operating phases. According to linear circuit theory, the offset in each group cancels perfectly, yet in the presence of small nonlinearities the offset in each group is still small but different from zero. Moreover, at least in the linear case it is obvious that the current does not need to be constant over all six operating phases; it is sufficient to keep the current constant for both operating phases in each group, yet it can vary from the current in others of the three groups. Therefore, it can be advantageous in embodiments to execute the various operating phases in a sequence in which the two phases in each group are adjacent or close in time. In practice, thermal drift, flicker noise or other events can change the current from phase to phase, though these effects can be minimized by executing the phases of a group immediately sequentially in embodiments.

Referring to FIG. 3, the Iu-biasing methodology can be extended for a plurality of multi-contact sensor devices with the output of each considered differentially. This can help to reduce the degree of accuracy required of the signal processing circuitry of circuitry 101, which is discussed in more detail below. In an embodiment, therefore, two three-contact vertical Hall sensor devices 100 and 200 each comprising three contacts 102, 104, 106 and having differential output voltages can be used. Two current sources, one for each device 100 and 200, are used. It is desired that the current sources are identical, though if not any mismatch can be canceled as part of the offset elimination.

Figure 3A:
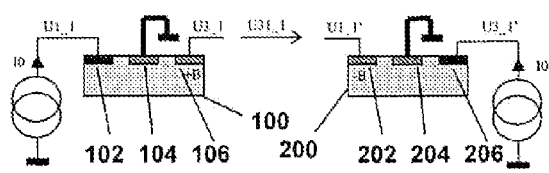
FIG. 3A is a circuit diagram of a sensor device in a first operating phase according to an embodiment.
Figure 3A:
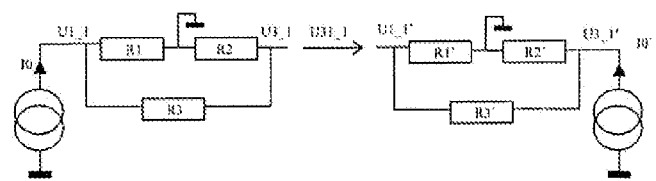

Referring to FIG. 3A, in Phase 1 device 100 is operated as it was in Phase 1 of the single-device embodiment discussed above with reference to FIG. 2 while device 200 is operated as the single device was in Phase 3. The output voltage, denoted as U31_1 with the numerals refer to the third contact of device 100 (3), the first contact of device 200 (1) and Phase 1 (1), is the difference between the output voltages of the two devices 100 and 200, with prime values referring to device 200 and the others to device 100:

$$U31\_1 = U3\_1 - U1\_1' = I0*R1*R2/(R1+R2+R3) - I0'*R1'*R2'/(R1'+R2'+R3').$$

This reduces the raw offset while also doubling the magnetic sensitivity. The raw offset is the output signal in a single operating phase at zero input magnetic field. For example, for R1=R2 =kΩ, R3=2kΩ and I0=1 mA, the raw offset of device 100 is U3_1=250 mV. For R1'=R2'=1010Ω, R3'=1900Ω and I0'=1.01 mA, the raw offset of device 100' is U1_1'=262.8 mV. The raw offset of the differential signals is U31$_{1=}$12.8 mV, which is roughly twenty times smaller.

Figure 3B:
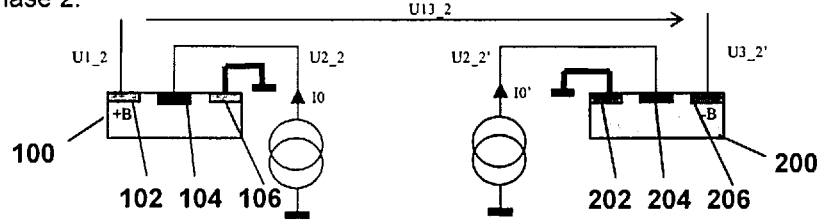
FIG. 3B is a circuit diagram of a sensor device in a second operating phase according to an embodiment.
Figure 3B:
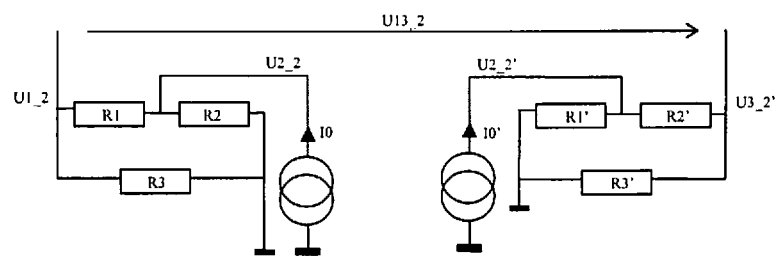

Phase 2 is depicted in FIG. 3B, in which device 100 is coupled as in Phase 2 of the embodiment of FIG. 2 and device 200 is coupled as in Phase 4. The raw offset output, U13_2, is:

$$U13\_2 = U1\_2 - U3\_2' = I0*R2*R3/(R1+R2+R3) - I0'*R1'*R3'/(R1'+R2'+R3').$$

Figure 3C:
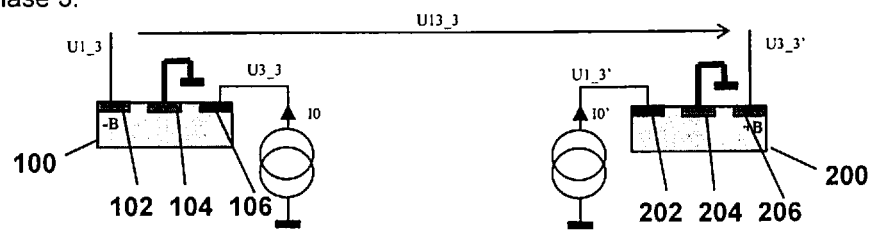
FIG. 3C is a circuit diagram of a sensor device in a third operating phase according to an embodiment.
Figure 3C:
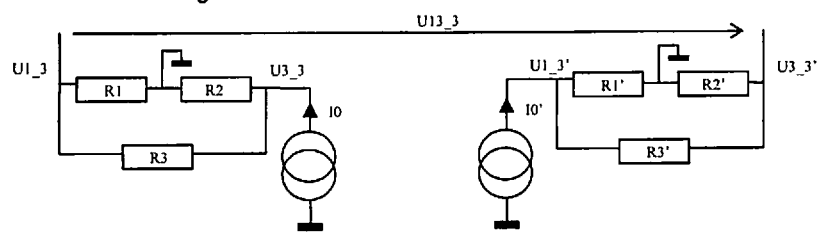

Referring to FIG. 3C, in Phase 3 the raw offset output voltage, U13_3, is:

$$U13\_3 = U1\_3 - U3\_3' = I0*R1*R2/(R1+R2+R3) - I0'*R1'*R2'/(R1'+R2'+R3').$$

Figure 3D:
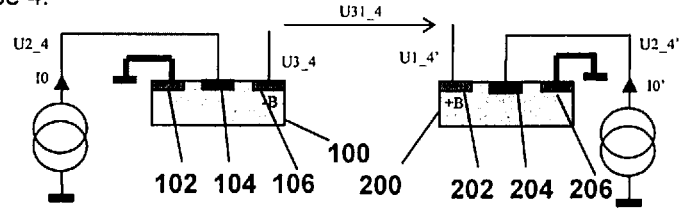
FIG. 3D is a circuit diagram of a sensor device in a fourth operating phase according to an embodiment.
Figure 3D:
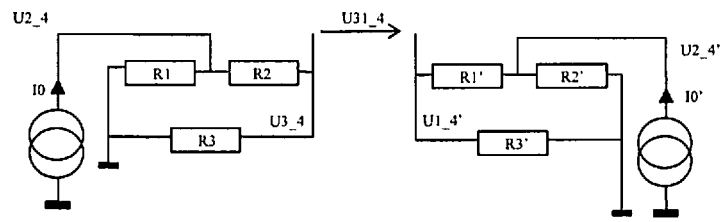

Referring to FIG. 3D, in Phase 4 is the raw offset output voltage is:

$$U31\_4 = U3\_4 - U1\_4' = I0*R1*R3/(R1+R2+R3) - I0'*R2'*R3'/(R1'+R2'+R3')$$

Figure 3E:
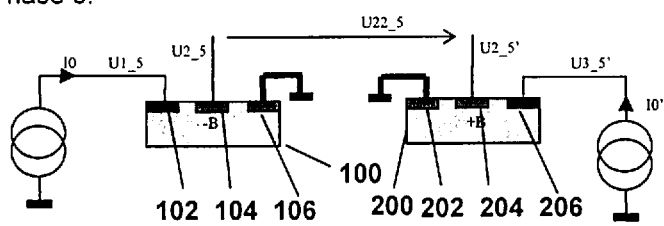
FIG. 3E is a circuit diagram of a sensor device in a fifth operating phase according to an embodiment.
Figure 3E:
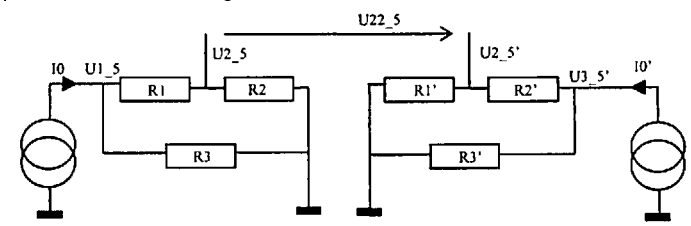

The coupling arrangement of Phase 5 is depicted in FIG. 3E, in which the raw offset output voltage is:

$$U22\_5 = U2\_5 - U2\_5' = I0*R2*R3/(R1+R2+R3) - I0'*R1'*R3'/(R1'+R2'+R3')$$

The final phase, Phase 6, is depicted in FIG. 3F. The raw offset output voltage is:

$$U22\_6 = U2\_6 - U2\_6' = I0*R1*R3/(R1+R2+R3) - I0'*R2'*R3'/(R1'+R2'+R3')$$

As in the single device embodiment of FIG. 2, the difference in output voltages between Phases 1 and 3 (U 31_1−U 13_3) cancels the offset and doubles the magnetic sensitivity. The same is true for Phases 2 and 5 (U13_2 −U22_5) and for Phases 4 and 6 (U31_4−U22_6). The total output signal could be any of these subcombinations, though improved results can be obtained by combining at least two or all three of them. Using all three, the total output signal, Utotal, becomes:

$$U\text{total} = (U31\_1-U13\_3) + (U13\_2-U22\_5) - (U31\_4-U22\_6) = U31\_1 + U13\_2 + U22\_6 - U13\_3 - U31\_4 - U22\_5$$

Thus, the signals of Phases 1, 2 and 6 are added, as are the output signals of Phases 3, 4 and 5, then the second sum is subtracted from the first, which provides improved cancelation of offset while maintaining high magnetic sensitivity.

An advantage of the Iu-biasing mode of FIG. 3 (two devices) over the same mode for a single device (FIG. 2) is that the raw offset can be reduced by about two or three orders of magnitude. For example, in FIG. 2A, the raw offset is the voltage U3_1 at zero magnetic field. If, for example, U1_1 is 1 V, then U3_1 is about 0.4 V. Conversely, and referring to FIG. 3A, U3_1 is again 0.4 V, but U1_1' is also 0.4 V if the devices 100 and 200 are identical. In practice, there is typically a small mismatch between devices 100 and 200 such that U3_1−U1_1' is equal to several millivolts. This is still much less, however, than 0.4 V of FIG. 2A. This means, in one example, that the signal conditioning circuitry of device 10 need not be as accurate. For example, in an embodiment of a single device the accuracy can be within about 6 ppm, while for the embodiment of FIG. 2 it can be about 3000 ppm.

The second mode of operation, Ui-forcing, will now be discussed with reference to both single and multi-device embodiments, as for Iu-biasing. In Ui-forcing, the current source of the Iu-biasing mode is replaced by a voltage source, Vsupply, that supplies a constant voltage source to the supply terminal across all operating phases, or at least across operating phases 1 and 3, 2 and 5 or 4 and 6. The signal contact is also supplied with a voltage, Vf, which clamps or forces the sense terminal to the same voltage as the center terminal. If only a single device 100 is present and it is desired to measure current at the output, clamping the output to some potential can accomplish this. In embodiments, it has been discovered to be advantageous to choose Vf in each phase to be identical to the center contact such that the offset is canceled across, e.g., four phases. Thus, Vf is not arbitrary and is also not identical in each phase. In other embodiments, Vf could be arbitrary, such as if more, e.g., six, phases are used. The current flowing into the output terminal is then measured to obtain the output.

Referring to FIG. 4A, an equivalent circuit of sensor device 100 as in FIG. 2A is depicted, coupled as for Ui-forcing instead of Iu-biasing. In other words, the current supply of FIG. 2A coupled to contact 102 is replaced by a voltage source, Vsupply, and contact 106, the sense terminal, is forced to the same potential as contact 104, which was grounded in FIG. 2A. Therefore, contact 106 in FIG. 4A is supplied with a voltage of Vf=0. The output at contact 106, I3_1, is:

$$I3\_1 = -V\text{supply}/R3$$

Phase 2 is depicted in FIG. 4B, in which contact 102 is the sense terminal, contact 104 is the supply terminal and contact 106 is grounded. Therefore, contact 102 is forced to Vf=Vsupply. The output at contact 102, I1_2, is then:

$$I1\_2 = V\text{supply}/R3$$

Figure 4C:
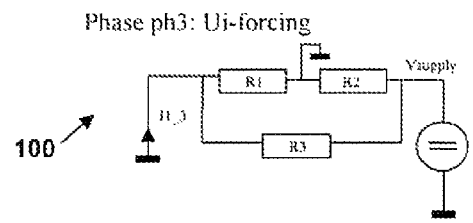
FIG. 4C is a circuit diagram of a sensor device in a third operating phase according to an embodiment.

In FIG. 4C, Phase 3 is depicted. Contact 102 is the sense terminal, contact 104 is grounded and contact 106 is the supply terminal, with contact 102 forced to Vf=0. The output, I1_3, is:

$$I1\_3 = -V\text{supply}/R3$$

Figure 4D:
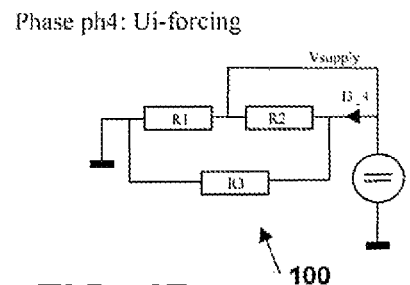
FIG. 4D is a circuit diagram of a sensor device in a fourth operating phase according to an embodiment.
Figure 5A:
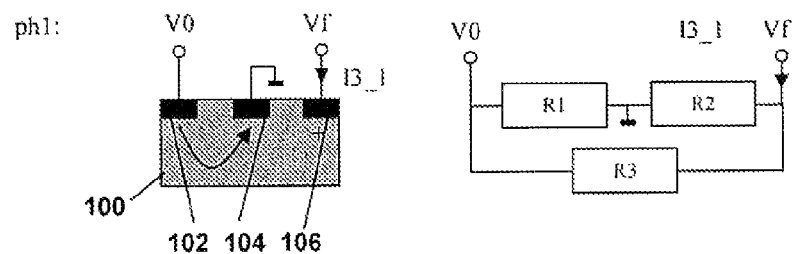
FIG. 5A is a circuit diagram of a sensor device in a first operating phase according to an embodiment.
Figure 5B:
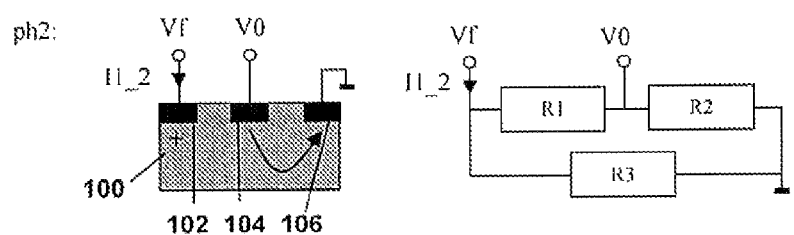
FIG. 5B is a circuit diagram of a sensor device in a second operating phase according to an embodiment.
Figure 5C:
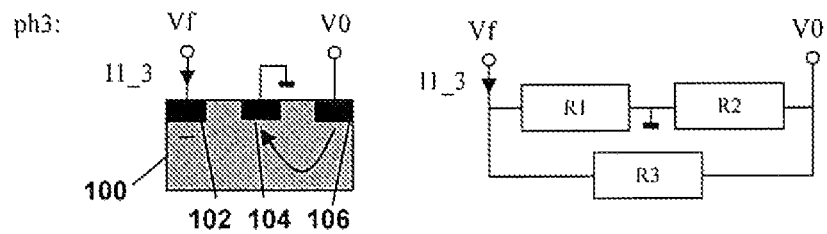
FIG. 5C is a circuit diagram of a sensor device in a third operating phase according to an embodiment.
Figure 5D:
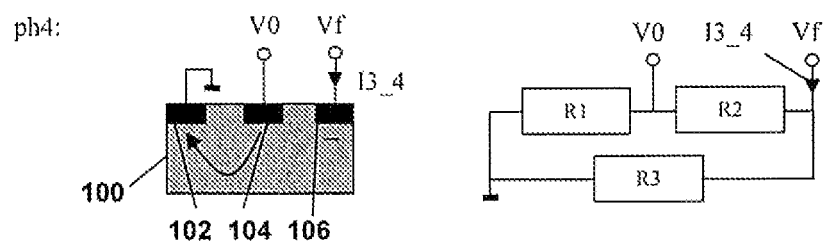
FIG. 5D is a circuit diagram of a sensor device in a fourth operating phase according to an embodiment.
Figure 5E:
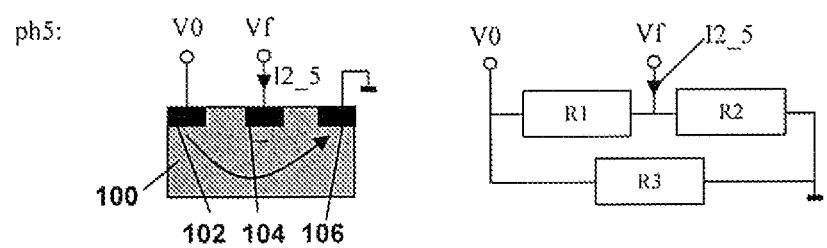
FIG. 5E is a circuit diagram of a sensor device in a fifth operating phase according to an embodiment.
Figure 5F:
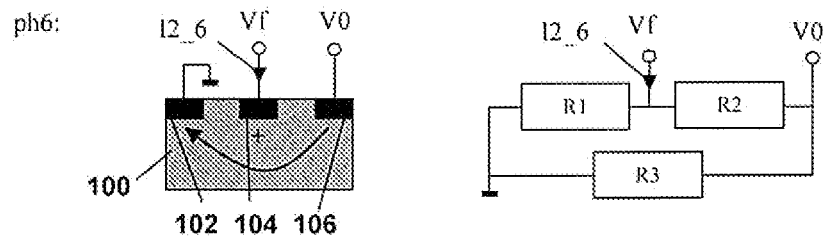
FIG. 5F is a circuit diagram of a sensor device in a sixth operating phase according to an embodiment.

Phases 5 and 6 are skipped, making Phase 4 depicted in FIG. 4D the final phase in this embodiment. Contact 102 is ground, contact 104 is the supply terminal and contact 106 is the sense terminal, with contact 106 forced to Vf=Vsupply. The output, I3_4, is:

$$I3\_4 = V\text{supply}/R3$$

The total signal, Itotal, then is:

$$I\text{total} = I3\_1 + I1\_2 - I1\_3 - I3\_4$$

This cancels the offsets while adding the applied magnetic fields. In other embodiments, only two phases can be used, such as Phases 1 and 2 or Phases 3 and 4 or others, though using four provides better offset cancelation. As discussed above, two phases can be arranged in a group such that the raw offset of each phase cancels in linear circuit approximation, e.g., I3_1+I1_2 or I3_1–I1_3. The other two phases form a second group. This makes it possible in embodiments to have different supply voltages in the first and second groups, though in general is can be advantageous in embodiments to use the same voltage across groups. Nevertheless, the supply voltage can be trimmed for the second group, for example, in an end-of-line test in order to get a small residual offset. In yet other embodiments, additional operating phases also can be used.

In other embodiments, the potential at the sense terminal can be forced to something other than that present at the center contact 104. Referring to FIG. 5, a six-phase embodiment is depicted. Phases 1-4 of FIGS. 5A-5D are consistent with the same phases in FIGS. 4A-4D discussed above except that Vf is not necessarily the same as the potential at center contact 104. Phases 5 and 6 in FIGS. 5E and 5F, respectively, are added. In Phase 5, contact 102 is the supply contact, contact 104 is the sense contact forced to a voltage Vf, and contact 106 is ground. In Phase 6, contact 102 is ground, contact 104 is the sense contact forced to Vf, and contact 106 is the supply terminal.

The output currents in each phase are then as follows:

$$I3\_1=Vf/R2+(Vf-V0)/R3$$

$$I1\_2=(Vf-V0)/R1+Vf/R3$$

$$I1\_3=Vf/R1+(Vf-V0)/R3$$

$$I3\_4=Vf/R3+(Vf-V0)/R2$$

$$I2\_5=Vf/R2+(Vf-V0)/R1$$

$$I2\_6=Vf/R1+(Vf-V0)/R2,$$

with the total signal, Itotal, being:

$$I3\_1+I1\_2-I1\_3-I3\_4-I2\_5+I2\_6$$

This cancels the offset while amplifying the magnetic sensitivity. Not forcing Vf to the potential of the center contact 104 provides additional flexibility that can, in embodiment, be strategically utilized to further reduce the residual offset. Fundamentally, Vf can be chosen to minimize the residual offset from the beginning. Because the residual offset depends, at least in part, on the nonlinearity of sensor device 100, Vf can be a fixed value in embodiments if the nonlinearity is relatively constant across a plurality of devices 100. In other embodiments, devices 100 can be tested in end-of-line testing, and Vf can be programmed in memory of sensor 10.

Figure 6A:
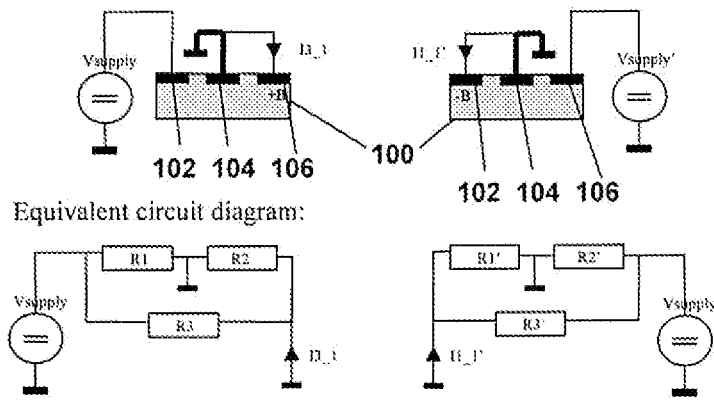
FIG. 6A is a circuit diagram of a sensor device in a first operating phase according to an embodiment.

Ui-forcing, like Iu-biasing, can also be extended to multi-sensor devices. In the multi-sensor Iu-biasing mode, two current sources were used, one for each device. In embodiments of multi-sensor Ui-forcing, however, only a single voltage source is used. Due to restrictions in circuit design, however, it can happen that nominally identical voltage sources are used yet they have a slight mismatch. Therefore, the figures show Vsupply and Vsupply' to account for this mismatch. As in some embodiments of Iu-biasing, the sense terminal is forced to a voltage, Vf, that is the same as the potential at center contact 104 in embodiments of multi-contact Ui-forcing. The potential Vf can be constant during all phases of the spinning current scheme in embodiments, or it can vary in others. In one embodiment, a circuit can adjust the potential Vf for each operating phase such that the common mode current (i.e., [I3_1+I1_1']/2 in Phase 1 of FIG. 6A) vanishes. The output of the multi-sensor device in each phase is the difference in the output currents of the two devices, and four phases are used, though the number of phase and order thereof can vary in other embodiments. The total signal can be taken as the difference between Phases 1 and 3, or between Phases 2 and 4, in embodiments, though in another embodiment the total output signal is the sum of both of these differences to provide the most effective residual offset reduction.

Given this, Phases 1-4 are depicted in FIGS. 6A-6D, respectively. In Phase 1, FIG. 6A the raw offset is:

$$I31\_1=I3\_1-I1\_1'=-Vsupply/R3+Vsupply'/R3'$$

Figure 6B:
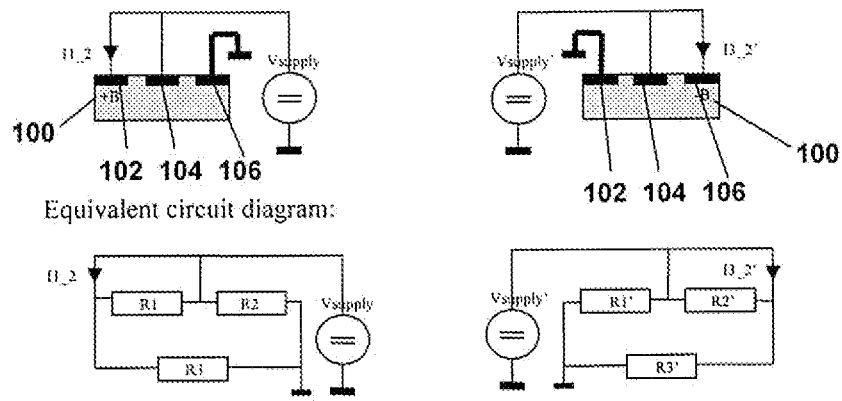
FIG. 6B is a circuit diagram of a sensor device in a second operating phase according to an embodiment.

In Phase 2, FIG. 6B, the raw offset is:

$$I13\_2=I1\_2-I3\_2'=Vsupply/R3-Vsupply'/R3'$$

Figure 6C:
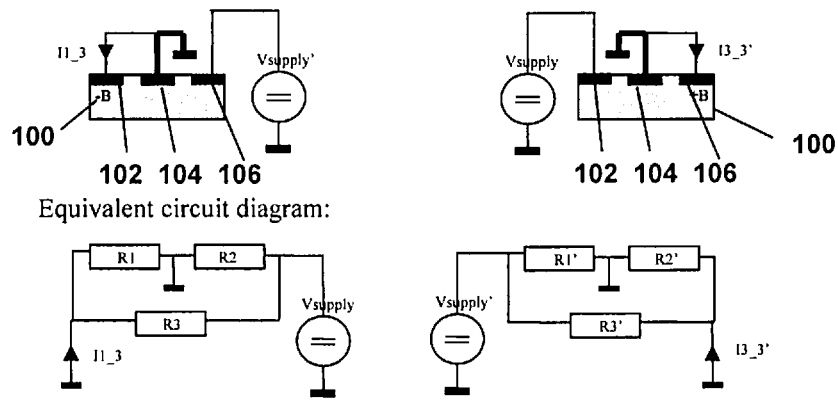
FIG. 6C is a circuit diagram of a sensor device in a third operating phase according to an embodiment.

In Phase 3, FIG. 6C, the raw offset is the same as in Phase 1, which as previously mentioned in other embodiments cancels the offset and doubles the magnetic sensitivity:

$$I13\_3=I1\_3-I3\_3'=-Vsupply/R3+Vsupply'/R3'$$

Figure 6D:
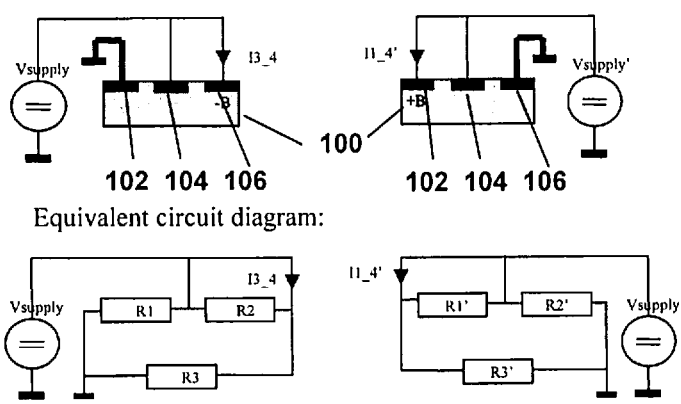
FIG. 6D is a circuit diagram of a sensor device in a fourth operating phase according to an embodiment.

In Phase 4, FIG. 6D, the raw offset is the same as in Phase 2, which again cancels the offset and doubles the magnetic sensitivity:

$$I31\_4=I3\_4-I1\_4'=Vsupply/R3-Vsupply'/R3'$$

Itotal can be the differences in the like phases, i.e., I31_1–I1__3 or I13_2–I31_4, or all can be combined for the greatest reduction in residual offset cancelation:

$$Itotal=(I31\_1-I13\_3)+(I13\_2-I31\_4)=I31\_1+I13\_2-I13\_3-I31\_4$$

If six phases are used instead of four, Itotal becomes:

$$Itotal=(I31\_1-I13\_3)+(I13\_2-I31\_4)+(I22\_6-I22\_5)=I31\_1+I13\_2+I22\_6-I13\_3-I31\_4-I22\_5$$

If four phases are used, the signal contacts are forced to the potential of the center contact. Conversely, if six phases are used the signal contacts are forced to potential Vf, which is constant during all six phases in embodiments, or at least during the phases of each group, as in brackets in the equation above. In embodiments comprising two devices 100 and six phases, Vf can also vary with operating phase as mentioned above with respect to adjusting Vf such that the common mode current vanishes.

Figure 7:
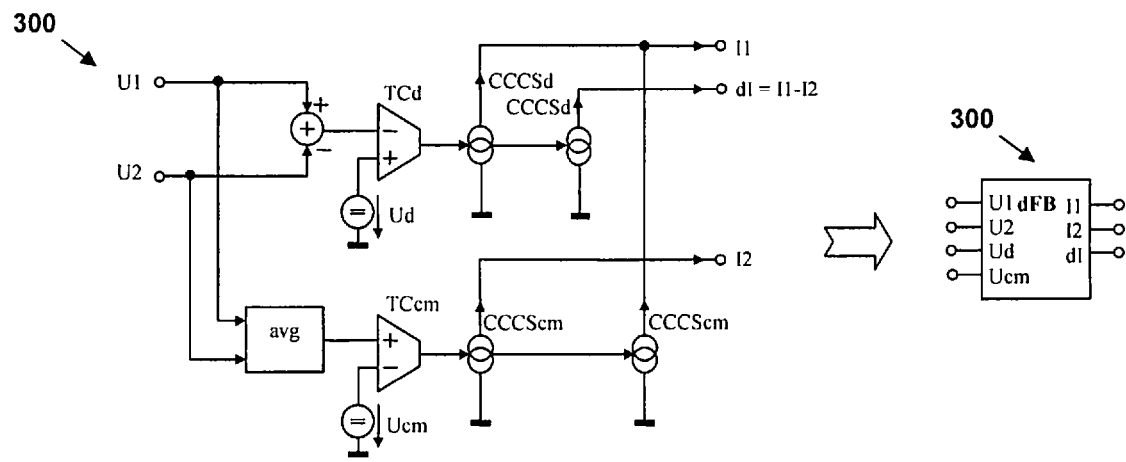
FIG. 7 is a block diagram of a differential feedback circuit according to an embodiment.

While embodiments provide reduction or elimination of residual offset, subtraction of two large currents by circuitry 101 results, which can be a challenge, requiring high accuracy of circuitry 101. One way to improve this is to separate the common mode sense current from the differential mode sense current by using, for example, a differential feedback circuit 300 as depicted in FIG. 7. Circuit 300 of FIG. 7 is merely one embodiment of such a circuit, and circuit 300 can vary in other embodiments. Circuit 300 operates to force the sense terminals of the sensor elements, such as sensors 100 and 200 of FIG. 6, to Vf.

Circuit 300 can be part of circuitry 101 of sensor 10. In an embodiment, circuit 300 has two inputs, U1 and U2, with U2 to be subtracted from U1. The outputs of circuit 300 are three currents: I1, I2 and dI. Circuit 300 uses two reference voltages Ud and Ucm and controls I1 and I2 such that U1−U2=Ud and (U1+U2)/2=Ucm. The difference between U1 and U2 is compared with Ud by amplifier TCd. If U1 −U2 <Ud, then TCd outputs a large current to the two current-controlled current sources CCCSd, which also output large positive currents, denoted by the arrows at the outputs of the CCCSds in FIG. 7.

Thus, ICCCSd=−(U1−U2 −Ud)*Ad*gmd, where Ad is the open loop gain of TCd and gmd is the transconductance of CCCSd.

In the lower portion as depicted in FIG. 7, circuit 300 also averages U1 and U2 and compares this value, by TCcm, with Ucm. If the average is greater than Ucm, then TCcm outputs a large voltage to both CCCScm, which in turn output large currents. Thus, ICCCScm=(U1/2+U2/2−Ucm) *Acm*gmc=ICCCScm, wherein Acm is the open loop gain of TCcm and gmc is the transconductance of CCCScm.

Figure 8:
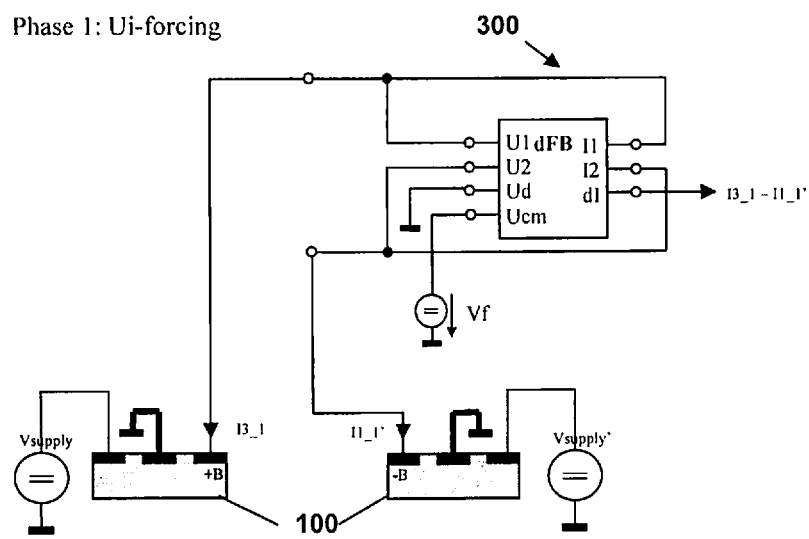
FIG. 8 is a block diagram of the circuit of FIG. 7 coupled to the sensor device of FIG. 6A for Vf=0 V.

Because I1=ICCCSd+ICCCScm and I2=ICCCScm, I1>I2 for ICCCSd>0. Moreover, (U1+U2)/2=Ucm and U1−U2=0. Circuit 300 can be coupled to sensor devices 100 and 200 in multi-sensor embodiments. FIG. 8 depicts such a coupling for Phase 1 of Ui-forcing. In FIG. 8, circuit 300 forces both sense contacts (contact 106 of sensor 100 and contact 102 of sensor 200) to Vf and outputs I3_1−I1_1' for Phase 1. In subsequent phases, the coupling arrangement between circuit 300 and sensors 100 and 200 is simply altered according to the phase diagrams depicted and discussed herein.

Figure 9:
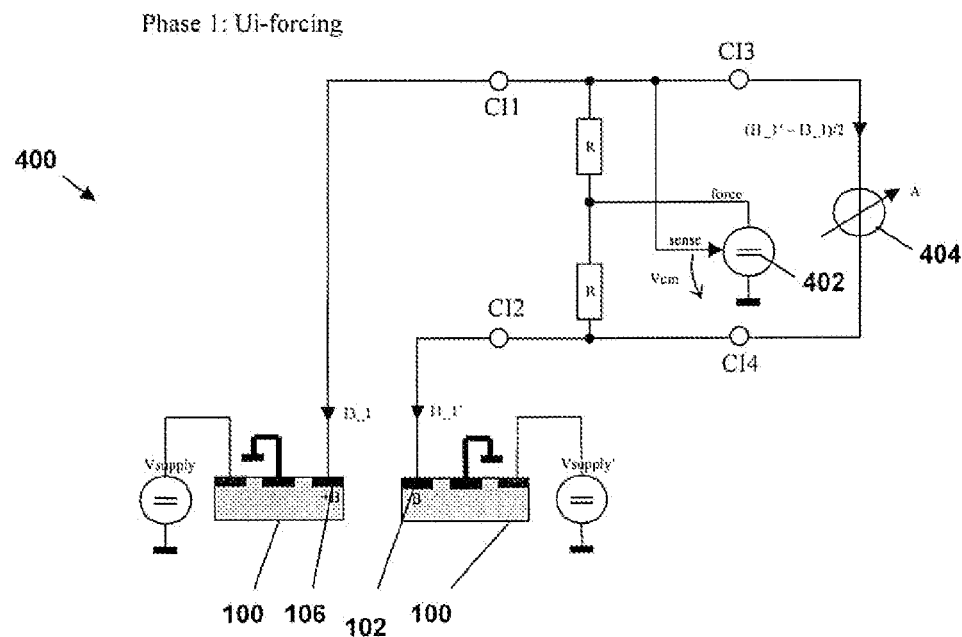
FIG. 9 is a block diagram of a circuit according to an embodiment.

Another circuit 400 for implementing Ui-forcing with multiple devices is depicted in FIG. 9. Circuit 400 uses a single voltage source 402 for Vf and an amperemeter 404. In operation, voltage source 402 establishes a common mode voltage Vcm on at least one of the two sense terminals (contacts 106 and 102 in the left and right devices 100, respectively), and amp meter 404 shorts the contacts 106 and 102 to measure the short circuit current between them. Two resistors R ensure that the same current is provided to both contacts 106 and 102. A mismatch between resistors R can cause a portion of the common mode current to flow through amp meter 404. Therefore, circuit 400 can further comprise switches to switch terminals CI1 and CI2 in embodiments to cancel any mismatch. In another embodiment, terminals CI3 and CI4 also can be switched.

In essence, circuit 400 provides a way for only the differential current (I3_1+I 1_1')/2 flows through amp meter 404, while only the common mode current is supplied by voltage source 402.

Figure 10:
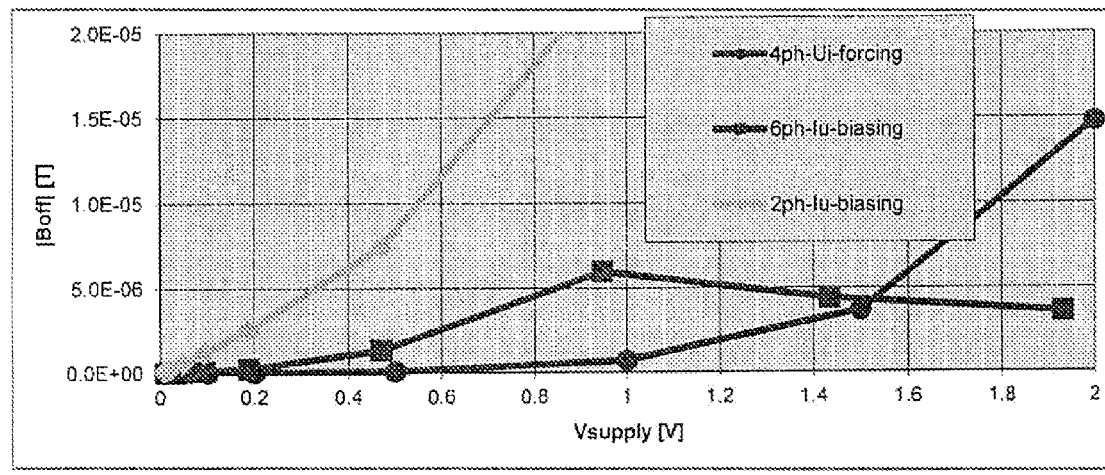
FIG. 10 is a graph of residual offset versus supply voltage for two-, four- and six-phase embodiments.

Both Iu-biasing and Ui-forcing, in either single or multi-sensor configurations, provide reductions in residual offset that are more significant than conventional approaches, including traditional spinning current modes. Referring to FIG. 10, with respect to single sensor configurations, such as those discussed with respect to FIGS. 2 and 4, Ui-forcing in four phases can provide enhanced residual offset cancelation when compared with Iu-biasing in six phases in Hall sensor devices having supply voltages below some voltage, for example 1.5 V. On the other hand, six-phase Iu-biasing can be superior to Ui-forcing for larger supply voltages.

Fundamentally, FIG. 10 shows the advantages provided by the four-phase and six-phase embodiments discussed herein over those having only two phases. In a two-phase embodiment, the residual offset can be seen to be much higher and literally off the chart at supply voltages above about 0.9 V.

Figure 11A:
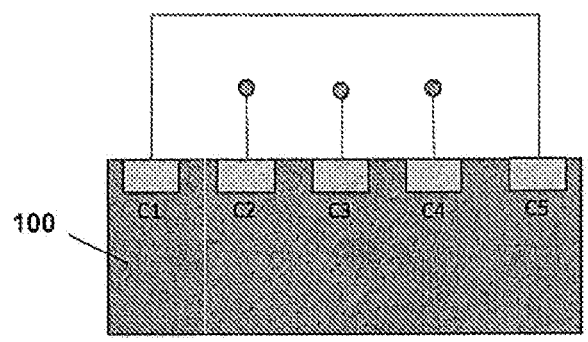
FIG. 11A is a cross section diagram illustrating a five contact vertucak Hall device according to an embodiment.
Figure 11B:
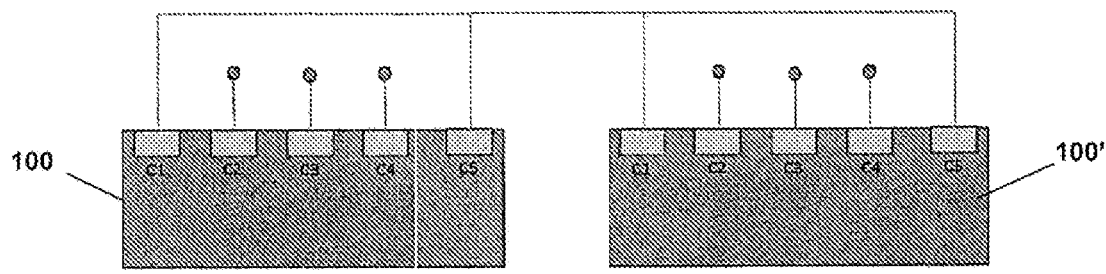
FIG. 11B illustrates is a cross section diagram illustrating multiple five contact vertical Hall devices coupled together according to an embodiment.

Referring to FIG. 11, while embodiments have been discussed herein with respect to three-contact devices, devices having more than three contacts also can be used in embodiments. In these embodiments, three of the contacts are still used fundamentally as discussed herein, while the additional contacts are simply not used for these supply and sense purposes. For example, a five-contact vertical Hall device 100 can be used having contacts C1, C2, C3, C4 and C5. In an embodiment, contacts C2, C3 and C4 are used as the supply and sense terminals in the various operating phases as discussed herein with reference to contacts 102, 104 and 106, while C1 and C5 are not used or are used for other purposes, or are shorted, in embodiments, to improve the symmetry of the device. These devices having more than three contacts can be applicable to any of the embodiments discussed herein, such as the embodiment of FIG. 11B which couples two devices 100 and 100', as appreciated by those skilled in the art.

Figure 12:
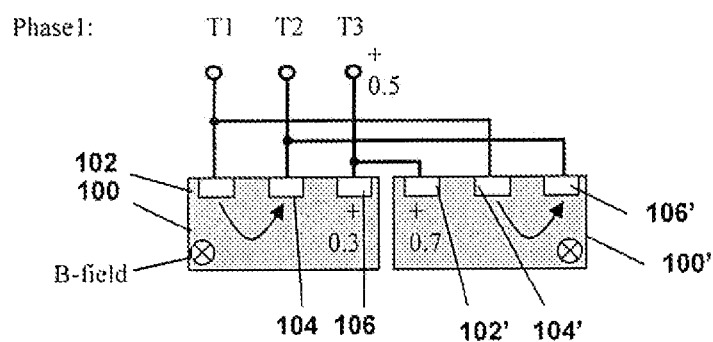
FIG. 12 is a circuit diagram of a sensor device in a first operating phase according to an embodiment.

In yet other embodiments, symmetrization can be improved by replacing a single sensor device 100 with a plurality of essentially identical sensor devices 100 coupled with one another. Referring to FIG. 12, a first device 100 and a second device 100' are depicted in cross-section coupled with one another. As in other embodiments, each device 100 and 100' comprises three contacts 102, 104, 106 and 102', 104', 106', respectively, though the number of contacts can vary as discussed herein above. The three terminals T1, T2 and T3 can then be coupled to terminals of another device, such as another arrangement of devices 100 and 100', in various operating phases as discussed herein above.

Figure 13A:
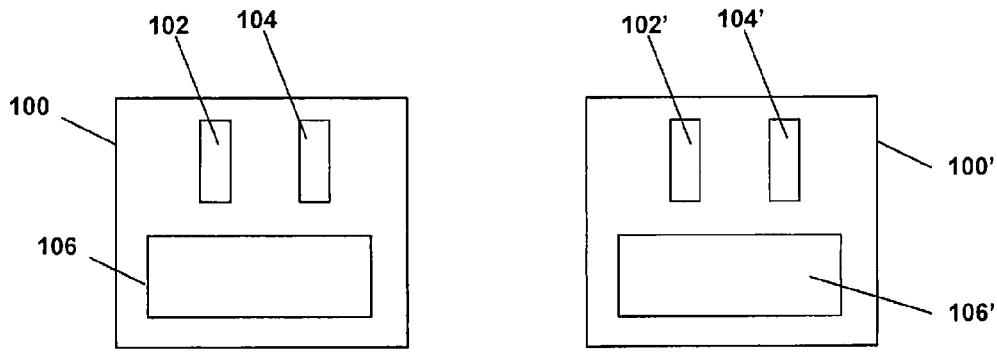
FIG. 13A is a block diagram of contacts of sensor elements according to an embodiment.
Figure 13B:
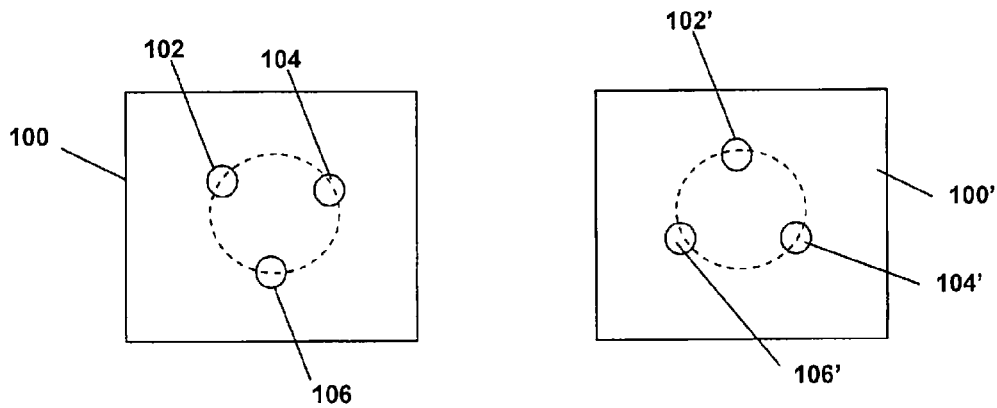
FIG. 13B is a block diagram of contacts of sensor elements according to an embodiment.

Moreover, the particular structure and composition of each device 100 and 100' can vary in embodiments related to devices 100 and 100' and others discussed herein. With respect to embodiments comprising devices 100 and 100', variations can occur so long as each device 100 and 100' remains essentially identical to the other. For example, each device 100 and 100' can laterally or vertically isolated from the other, or the devices 100 and 100' can be arranged relative to one another such that isolation is accomplished by a distance between contacts (106 and 102' as depicted in plan view in FIG. 12) of each device 100 and 100' being greater than a distance between contacts of one or the other of the devices 100 and 100' (e.g., between contacts 102 and 104, etc.). Each contact 102, 104, 106, 102', 104', 106' can be identical, or one or more can be larger or smaller. For example, in one embodiment depicted in the plan view of FIG. 13A, contacts 102, 104, 102' and 104' are similarly sized, while contacts 106 and 106' are larger. This is but one example. In FIG. 13B, contacts 102, 104, 106, 102', 104', 106' are again similarly sized but are each circular, spaced apart on each device 100 or 100' from one another by about 120 degrees and also rotated, between devices 100 and 100' by about 60 degrees. While FIG. 13A depicts a vertical Hall device, FIG. 13B can respond to both in-plane and out-of-plane magnetic fields. Other structural differences also can be present in embodiments, such as the presence or absence of top plates, additional tubs, tub patterning and other elements, as appreciated by those skilled in the art.

Referring again to FIG. 12, the direction of the external magnetic field is as indicated on each device 100 and 100', i.e., into the page as depicted in the drawing. This can vary in other embodiments. As depicted, contacts 102 and 104'; contacts 104 and 106'; and contacts 106 and 102' are each coupled with one another to form three terminals T1, T2 and T3, respectively. This is corresponds to a first phase, Phase 1, in which T1 is the supply terminal, T2 is ground and T3 is the signal terminal.

The voltage at T3 is about half that of the supply voltage because of the coupling of contacts 106 and 102'. The 0.3 and 0.7 in FIG. 12 indicate that the potential on the respective contact is about that percentage of the supply voltage, i.e., about 30% at contact 106 and 70% at contact 102', at zero magnetic field and in the absence of a short between contacts 106 and 102'. Thus, coupling the two results in an average, or about 50%, at T3 in Phase 1. In other phases, the common mode voltage is higher or lower, i.e., 60% or 40%, respectively, which still represents an improvement over conventional solutions in which the voltage can be 70% or 30%, respectively. In other words, smaller increases or jumps in the common mode voltage between operating phases are realized, improving sensor performance.

In subsequent phases in one embodiment, the couplings between devices 100 and 100' remain the same, while the use of terminals T1, T2, T3 changes. For example, in one embodiment, T1 is the signal terminal, T2 is the supply terminal and T3 is ground in Phase 2; T1 is ground, T2 is signal and T3 is supply in Phase 3; T1 is supply, T2 is signal and T3 is ground in Phase 4; T1 is ground, T2 is supply and T3 is signal in Phase 5; and T1 is signal, T2 is ground and T3 is supply in Phase 6. These coupling arrangements and sequences can vary in other embodiments, but in general the net result is that the combination of signals from all phases provides an increase in magnetic sensitivity and a decrease in offset error while also having a decreased jump in common mode voltage.

Figure 14A:
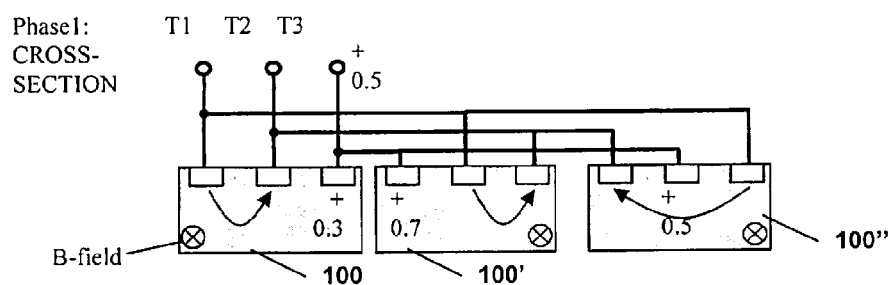
FIG. 14A is a circuit diagram of a sensor device in a first operating phase according to an embodiment.
Figure 14B:
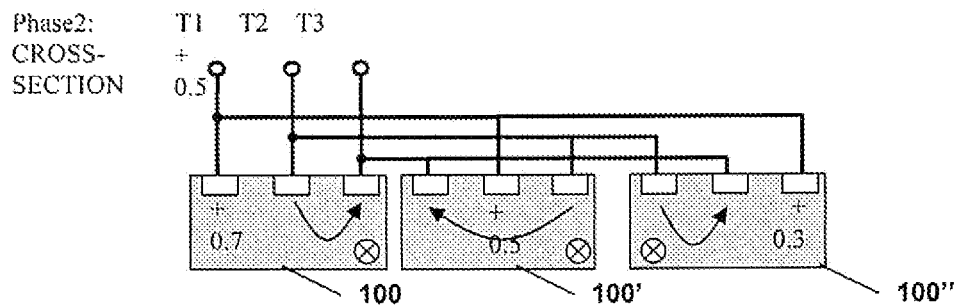
FIG. 14B is a circuit diagram of the sensor device of FIG. 14A in a second operating phase according to an embodiment.
Figure 14C:
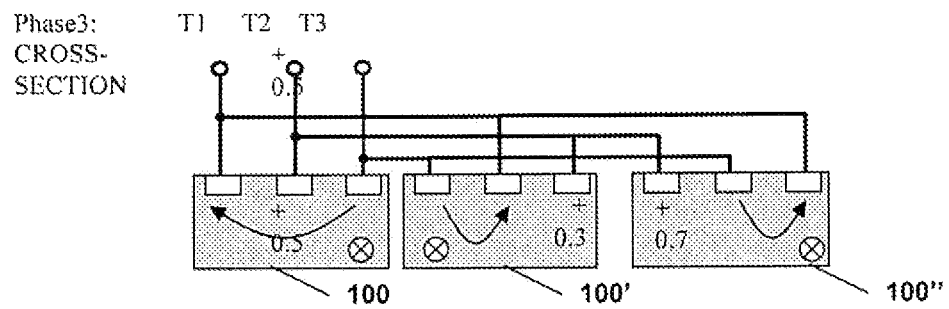
FIG. 14C is a circuit diagram of the sensor device of FIGS. 14A and 14B in a third operating phase according to an embodiment.
Figure 15A:
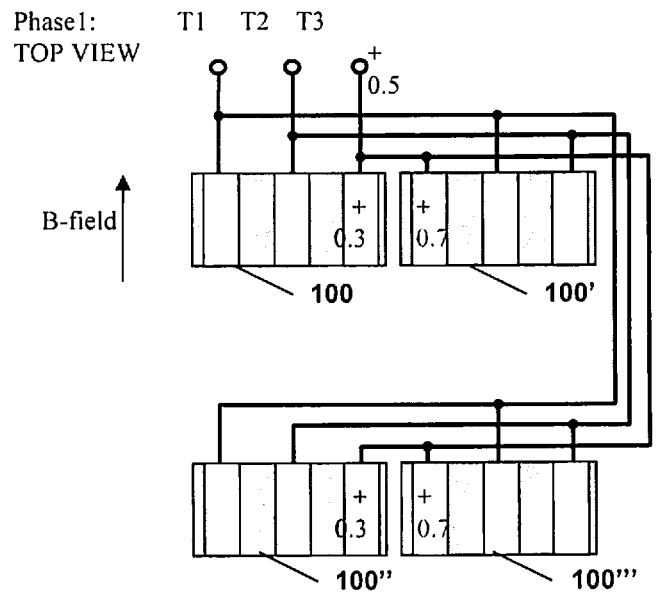
FIG. 15A is a circuit diagram of a sensor device in a first operating phase according to an embodiment.
Figure 15B:
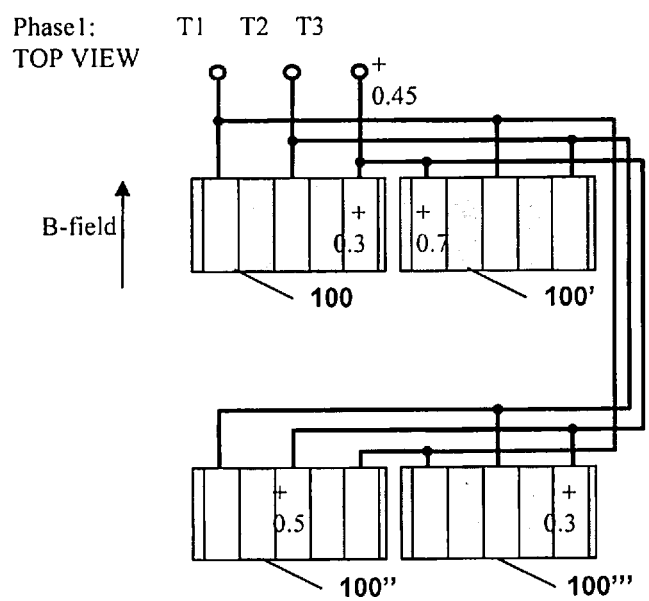
FIG. 15B is a circuit diagram of a sensor device in a first operating phase according to an embodiment.

In other embodiments, more than two devices 100 and 100' can be used. Referring to FIG. 14, an embodiment comprising three devices 100, 100' and 100" is depicted. Here again, the common mode potential at the signal terminal in each operating phase (Phases 1, 2 and 3 are depicted in FIGS. 14A, 14B and 14C, respectively) is 50% of the supply voltage. Referring to FIG. 15, four devices 100, 100', 100", 100''' are coupled in two different ways in each of FIGS. 15A and 15B. Note that in FIG. 15, top views, rather than cross-sections, are depicted.

In general, n devices can be coupled together. If the contacts of the n-th device are Cn1 $C_{N,1}$, $C_{N,2}$, $C_{N,3}$, then one embodiment of coupling the devices is as follows:

T1: $C_{1,1}, C_{2,2}, \ldots C_{N,mod(N+2;3)+1}$
T2: $C_{1,2}, C_{2,3}, \ldots C_{N,mod(N+3;3)+1}$
T3: $C_{1,3}, C_{2,1}, \ldots C_{N,mod(N+4;3)+1}$ Thus, in an embodiment with five devices 100, the terminals T1, T2 and T3 are coupled as follows:

T1: $C_{1,1}, C_{2,2}, C_{3,3}, C_{4,1}, C_{5,2}$
T2: $C_{1,2}, C_{2,3}, C_{3,1}, C_{4,2}, C_{5,3}$
T3: $C_{1,3}, C_{2,1}, C_{3,2}, C_{4,3}, C_{5,1}$

This, again, is but one example embodiment, and other configurations, numbers of devices and other characteristics can vary in other embodiments. Such a configuration of five devices 100 can then be coupled to another such configuration, or to some other, as discussed herein above.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A sensor device comprising:
at least one sensor element configured to sense a physical characteristic and comprising three contacts; and
sensor circuitry coupled to the at least one sensor element and configured to operate the at least one sensor element in a plurality of operating phases such that in each operating phase a supply current is injected into one of the three contacts as a supply contact and a potential is measured at a second of the three contacts as a signal contact, each operating phase having a first arrangement of the three contacts as supply contact and signal contact and having a corresponding operating phase in which a second arrangement of the three contacts is reversed ones of the three contacts as the supply contact and the signal contact as compared with the first arrangement, and an output of the sensor device is a combination of the potentials measured at the signal contacts in the plurality of operating phases, wherein the plurality comprises each operating phase and the corresponding operating phase.

2. The sensor device of claim 1, wherein the at least one sensor element comprises a Hall sensor element.

3. The sensor device of claim 2, wherein the Hall sensor element is a vertical Hall sensor element.

4. The sensor device of claim 1, wherein the plurality of operating phases comprises at least two operating phases.

5. The sensor device of claim 4, wherein the plurality of operating phases comprises at least six operating phases.

6. The sensor device of claim 1, wherein the sensor element comprises an active region responsive to the physical characteristic, the active region extending into the sensor element from a first surface of the sensor element.

7. The sensor device of claim 6, wherein the three contacts are arranged on the first surface of the sensor element in ohmic contact with the active region.

8. The sensor device of claim 6, wherein the active region is responsive to magnetic field components that are perpendicular or parallel to the first surface.

9. The sensor device of claim 1, comprising first and second sensor elements, wherein the sensor circuitry is configured to measure a potential between the signal contact of the first sensor element and the signal contact of the second sensor element, wherein an output of the sensor device is related to a combination of the potentials measured in the plurality of operating phases.

10. The sensor device of claim 9, wherein the plurality of operating phases comprises at least two operating phases.

11. The sensor device of claim 1, wherein the three contacts are a first contact, a second contact and a third contact, and wherein the plurality of operating phases comprise at least two of the following groups: group 1 in which a first operating phase comprises the first contact as the supply contact and the third contact as the signal contact, and a second operating phase comprises the first contact as the signal contact and the third contact as the supply contact; group 2 in which a third operating phase comprises the first contact as the supply contact and the second contact as the signal contact, and a fourth operating phase comprises the first contact as the signal contact and the second contact as the supply contact; and group 3 in which a fifth operating phase comprises the second contact as the supply contact and the third contact as the signal contact, and a sixth operating phase comprises the second contact as the signal contact and the third contact as the supply contact.

12. The sensor device of claim 1, wherein a magnitude of the supply current is the same in the operating phase and the corresponding operating phase.

13. A sensor device comprising:
at least one sensor element configured to sense a physical characteristic and comprising three contacts; and
sensor circuitry coupled to the at least one sensor element and configured to operate the at least one sensor element in a plurality of operating phases such that in each operating phase first and second supply potentials are applied respectively to two of the three contacts as supply contacts and one of the supply potentials is applied to a third of the three contacts as a signal contact, a current at the third of the three contacts is measured, and an output of the sensor device is a combination of the current measured at the signal contact in each of the plurality of operating phases.

14. The sensor device of claim 13, wherein the at least one sensor element comprises a Hall sensor element.

15. The sensor device of claim 14, wherein the Hall sensor element is a vertical Hall sensor element.

16. The sensor device of claim 13, wherein the plurality of operating phases comprises at least two operating phases.

17. The sensor device of claim 16, wherein the plurality of operating phases comprises at least four operating phases.

18. The sensor device of claim 13, wherein each of the plurality of operating phases has a first arrangement of the three contacts as supply contacts and signal contact and has a corresponding operating phase in which a second arrangement of the three contacts comprises a same one of the supply contacts with the other one of the supply contacts and the signal contact being reversed as compared with the first arrangement.

19. The sensor device of claim 13, further comprising first and second sensor elements, wherein an output in each operating phase is a difference in the currents at the signal contacts of the first and second sensor elements, and wherein an output of the sensor device is related to a combination of the outputs of each operating phase.

20. The sensor device of claim 19, wherein the plurality of operating phases comprises at least four operating phases.

21. The sensor device of claim 13, wherein the sensor element comprises an active region responsive to the physical characteristic, the active region extending into the sensor element from a first surface of the sensor element.

22. The sensor device of claim 21, wherein the three contacts are arranged on the first surface of the sensor element in ohmic contact with the active region.

23. The sensor device of claim 21, wherein the active region is responsive to magnetic field components that are perpendicular or parallel to the first surface.

24. A sensor device comprising:
at least one sensor element configured to sense a physical characteristic and comprising three contacts; and
sensor circuitry coupled to the at least one sensor element and configured to operate the at least one sensor element in a plurality of operating phases such that in each operating phase first and second supply potentials are applied respectively to two of the three contacts as supply contacts and a forced potential that is the same in each of the plurality of operating phases is applied to a third of the three contacts as a signal contact, a current at the third of the three contacts is measured, and an output of the sensor device is a combination of the currents measured at the signal contacts in each of the plurality of operating phases.

25. The sensor device of claim 24, wherein the plurality of operating phases comprises at least three operating phases such that in a first operating phase a first of the three contacts is the signal contact, in a second operating phase a second of the three contacts is the signal contact, and in a third operating phase a third of the three contacts is the signal contact.

26. The sensor device of claim 24, wherein the plurality of operating phases comprises at least six operating phases such that in a first operating phase a first of the three contacts is the signal contact, the first supply potential is provided to a second of the three contacts, and the second supply potential is provided to a third of the three contacts; in a second operating phase a first of the three contacts is the signal contact, the second supply potential is provided to a second of the three contacts, and the first supply potential is provided to a third of the three contacts; in a third operating phase a second of the three contacts is the signal contact, the first supply potential is provided to a first of the three contacts, and the second supply potential is provided to a third of the three contacts; in a fourth operating phase a second of the three contacts is the signal contact, the second supply potential is provided to a first of the three contacts, and the first supply potential is provided to a third of the three contacts; in a fifth operating phase a third of the three contacts is the signal contact, the first supply potential is provided to a first of the three contacts, and the second supply potential is provided to a second of the three contacts; and in a sixth operating phase a third of the three contacts is the signal contact, the second supply potential is provided to a first of the three contacts, and the first supply potential is provided to a second of the three contacts.

27. The sensor device of claim 26, wherein the first, second, third, fourth, fifth and sixth operating phases are not sequential in numerical order.

28. The sensor device of claim 24, wherein the at least one sensor element comprises a Hall sensor element.

29. The sensor device of claim 28, wherein the Hall sensor element is a vertical Hall sensor element.

30. The sensor device of claim 24, wherein the sensor element comprises an active region responsive to the physical characteristic, the active region extending into the sensor element from a first surface of the sensor element.

31. The sensor device of claim 30, wherein the three contacts are arranged on the first surface of the sensor element in ohmic contact with the active region.

32. The sensor device of claim 30, wherein the active region is responsive to magnetic field components that are perpendicular or parallel to the first surface.

33. The sensor device of claim 24, further comprising first and second sensor elements, wherein in each of the plurality of operating phases the first and second supply potentials applied to each the first and second sensor elements are the same, an output of any one of the plurality of operating phases is related to a difference in currents measured at the signal contacts of the first and second sensor elements, and an output of the sensor device is related to a combination of the differences across the plurality of operating phases.

34. The sensor device of claim 33, wherein the forced potential applied to each the first and second sensor elements is the same.

* * * * *